United States Patent [19]
Kiermeier et al.

[11] Patent Number: 5,995,369
[45] Date of Patent: Nov. 30, 1999

[54] COOLING PLATE CONNECTING CLIP FOR POWER SEMICONDUCTORS

[75] Inventors: Theodor Kiermeier, Munich; Reinhard Lecheler, Neuburg an der Donau, both of Germany

[73] Assignee: Patent-Treuhand-Gesellschaft fuer elektrische Gluelampen mbH, Munich, Germany

[21] Appl. No.: 09/089,907

[22] Filed: Jun. 3, 1998

[30] Foreign Application Priority Data

Jun. 3, 1997 [DE] Germany ............... 197 23 270

[51] Int. Cl.[6] ................................ H05K 7/20
[52] U.S. Cl. .................. 361/704; 361/707; 361/709; 361/710; 361/717; 361/718; 361/719; 257/718; 257/719; 257/727; 174/16.3; 165/80.3
[58] Field of Search ................... 361/704, 709, 361/710, 711, 712, 713, 719; 257/718, 719, 727; 174/16.3; 165/80.2, 80.3

[56] References Cited

U.S. PATENT DOCUMENTS

| 4,054,901 | 10/1977 | Edwards et al. ............ 257/718 |
| 4,872,089 | 10/1989 | Ocken et al. ............... 361/710 |
| 5,130,888 | 7/1992 | Moore ....................... 165/80.3 |
| 5,321,582 | 6/1994 | Casperson ................. 361/713 |
| 5,804,875 | 9/1998 | Remsburg et al. ......... 257/718 |

*Primary Examiner*—Donald Sparks
*Assistant Examiner*—Boris L. Chervinsky
*Attorney, Agent, or Firm*—Carlos S. Bessone

[57] ABSTRACT

According to the invention, a common connecting clip (5) is used in the course of connecting two or more power semiconductors (4) on a board (3) to a cooling plate (1).

10 Claims, 2 Drawing Sheets

COOLING PLATE CONNECTING CLIP FOR POWER SEMICONDUCTORS

TECHNICAL FIELD

The invention is concerned with the field of mounting electronic and mechanical components of a circuit on a mounting board, for example a printed circuit board. In this context, it deals with the connection of power semiconductors to additional cooling plates for absorbing the heat loss arising in the power semiconductors and for dissipating this heat by heat conduction and by heat radiation from the relatively large surface of the cooling plate.

PRIOR ART

It is known to produce the mechanical and, via the mechanical contact, also thermal connection between the power semiconductors and cooling plates by the spring force of a connecting clip. For this purpose, a surface of a power semiconductor (here and below a cooling lug and similar integral parts are understood to belong to the semiconductor) and the corresponding surface of the cooling plate are placed against one another in a planar manner and are pressed together and held together by the clip that is slipped over. In this case, the power semiconductors are generally situated essentially vertically on the mounting board. In many cases, two or more power semiconductors appear in different mounting positions on a mounting board, and they have to be individually connected to a cooling plate.

DESCRIPTION OF THE INVENTION

The invention is based on the technical problem of simplifying the mounting step of connection between power semiconductors and cooling plates.

According to the invention, this problem is solved by a method for connecting at least one cooling plate to at least two power semiconductors, which lie with their largest surface in different planes and are mounted essentially vertically on a mounting board, in which method the cooling plate and a respective surface of the power semiconductors are pressed against one another in a planar manner by the spring force of a clip, characterized in that the connection is effected using just one clip, which has holding sections for a respective power semiconductor and a connecting section between the holding sections, and by a clip having at least two holding sections each having two limbs for pressing against one another, in a planar manner, a respective surface of one of at least two power semiconductors, with lie which their largest surface in different planes and are mounted essentially vertically on a mounting board, and of a cooling plate between the limbs of the holding section, and having a connecting section, which connects the holding sections and extends in a plane which is essentially perpendicular to the limbs of the holding sections, and also by an electronic assembly (that is to say on and with a mounting board) having at least two power semiconductors and a cooling plate and having a clip, of the type just described, which presses the cooling plate and the power semiconductors against one another.

The invention thus has the essential difference from the prior art that a single, common clip is used for two or more power semiconductors which are not arranged in a coplanar manner. For this purpose, the clip has, in addition to a holding section for each power semiconductor, a connecting section which bridges the distance and/or angle between the holding sections and thus establishes easy manipulability of the clip as a whole. Thus, in comparison with a simple clip without a connecting section, which clip consists only of a holding section in the shape of a U, for example, the connecting section permits the clip according to the invention also to be used for two or more power semiconductors which are not lying in one plane (with regard to their largest surface). With a conventional (but in this case lengthened or widened) clip structure, it would not be possible to connect these power semiconductors to their respective cooling plates using a single, common clip.

Building on the U-shape of a conventional clip, the clip according to the invention can in this case be constructed in a simple and practical geometry from two U-shaped holding sections which are held together by a connecting section which runs—as seen from a lateral view of the U-shape—essentially perpendicularly to the holding-section limbs.

Using a single clip for two or more power semiconductors significantly reduces the mounting outlay because fewer parts have to be stocked at the mounting location and held, moved and adjusted with respect to one another in the course of the mounting operation itself.

The advantages of the invention thus essentially concern a production method which is simplified in respect of the connection between the power semiconductors and the cooling plates, and thus overall an electronic assembly which is somewhat move cost-effective to produce. The features according to the invention that have been explained relate to the mounting method, on the one hand, and the correspondingly configured clip, on the other hand, and also to the correspondingly produced electronic assembly (that is to say circuit on and with the board).

If, in the case of the clip shape described, the connecting section maintains a certain vertical distance from the mounting board, in other words, in particular, runs somewhat set back with respect to that end of the holding sections which faces the said board, no geometrical restriction of the mounting options for components of the circuit is brought about by the clip running between the power semiconductors as well, in contrast to the prior art. This set-back state produces an intermediate region between the connecting section and the respective holding section which, for example, supplements the U as it were (at least initially) to form a transverse S.

The components then lying under the connecting part are upwardly covered to a certain extent by the clip. This covering may be essential not only for mechanical protection but also for reducing conducted radio interference. To that end, the clip is put at an essentially constant potential relative to its surroundings.

In half-bridge circuits, as are used, in particular, in electronic converters for low-voltage incandescent halogen lamps and in electronic ballasts for fluorescent lamps, for this purpose the clip is advantageously electrically conductively connected to the cooling lug of the "upper" half-bridge transistor, that is to say to the collector at the potential of the rectifier or the dc voltage supply. As a result, the clip and the cooling plate or plates act as a screening surface with regard to radio-frequency interference potentials. In contrast, the clip and the cooling plate are electrically insulated (for instance by means of a film which has little influence on the thermal conduction) from the collector of the "lower" half-bridge transistor, that is to say from the potential of the junction point between the two half-bridge transistors. The reason for this is as follows. The potential of the junction point fluctuates at high frequency in time with the half-bridge. The cooling lug, connected to this potential, of the lower half-bridge transistor consequently represents an interference potential with respect to the surroundings. If this interference potential surface were enlarged by contact with the cooling plate and/or the clip, then the undesirable radio interference would increase considerably. For the sake of completeness, it may be mentioned that, of course, the collector (or cooling lug) of at least one of the two half-bridge transistors must be electrically insulated from the metallic clip. The upper half-bridge transistor would otherwise be short-circuited by means of the clip. The clip actually acts as a screen only given the above-described contact-making that is correct according to the invention. It is only in this case that the otherwise customary radio interference is reduced further.

The screening function is accentuated by a planar design of the connecting section. In doing this, the function of the cooling plate or plates can also be effectively assisted by the larger radiating surface area of the clip. It is also possible to dispense with separate cooling plates altogether and manage just with integrated parts of the clip, namely parts of the holding sections or of the connecting section which are configured as a cooling plate. For this purpose, the corresponding sections must primarily be of large-area design. Furthermore, it is possible, for example, to provide large-area outer limbs of the holding sections with the insertion feet that are customary in the case of cooling plates. This integrated design further reduces the number of components and additionally simplifies mounting.

According to a further advantageous refinement of the invention, the distance between the holding sections may be slightly oversized, that is to say slightly too large relative to the distance predetermined by the distance between the power semiconductors, if appropriate taking account of the cooling plate thickness. The connecting section then becomes effective as a spring in the course of mounting. It is better able to perform this function primarily owing to its generally longer length in comparison with the spring properties of conventional clips or of the holding sections. In this case, the effective lever arm and thus the effective spring constant can be set in a particularly simple manner by the measure of the already described setting-back of the connecting section.

As a result of the pressing outwards operation, it is also possible, in addition, to establish or improve thermal contact with an outer housing part of the electronic assembly. And this also enlarges the effective cooling area.

If the housing consists of metal (protection class I), the clip and the cooling plate or plates are insulated from the housing.

The spring action can alternatively result solely from the holding sections (but in general from the entire clip).

A preferred field of application of the invention is in operating circuits for lamps, in particular in electronic converters for halogen lamps and ballasts for gas discharge lamps. Bridge circuits comprising power transistors are used in these circuits, the clip according to the invention making it possible, for example, to connect the two transistors of a half-bridge or else all four transistors of a full bridge in each case to cooling plates.

With the invention, as in the prior art, it is possible to use both individual cooling plates for each power semiconductor and common cooling plates for two or more power semiconductors. In the latter case, use is frequently made of U-shaped cooling plates in which each limb, on a respective side of the mounting board, is connected to the corresponding power semiconductor by the clip. In this case, the base of the U is generally situated under the mounting board, and, consequently, with appropriate connection—advantageously by means of the clip itself and, furthermore, in conjunction with the described screening function of the planar connecting section—ensures additional (underside) screening of the circuit (with regard to radio-frequency interference potentials). In addition, mounting is simplified further. The U-shaped cooling plates described are, however, slightly more expensive even though they replace two or more simple plates.

The practical properties of the invention can be improved further by a projection on an inner surface of a holding section, that is to say, for instance, on the inner side of a limb of the U-shape. In the mounted state, the projection defines the (as far as possible central) point of action by the force from the corresponding part of the holding section and thus from the clip overall on the power semiconductor housing and ultimately on the cooling plate as well. This ensures a planar contact between the power semiconductor and its cooling lug, on the one hand, and the cooling plate, on the other hand, and, consequently, a good thermal contact between the two.

The projection can be produced in a simple manner using a punch-like tool which is used, prior to the bending of the final clip shape, to press out a corresponding part of the clip material (usually metal, in particular spring steel) from the other side. A matching tool contour predetermines the desired shape, for example a ramp shape with a gentle inclination for the purpose of facilitating the emplacement of the clip during mounting.

DESCRIPTION OF THE DRAWINGS

The invention will be explained in more detail below using an exemplary embodiment. In the figures.

Figure 1:
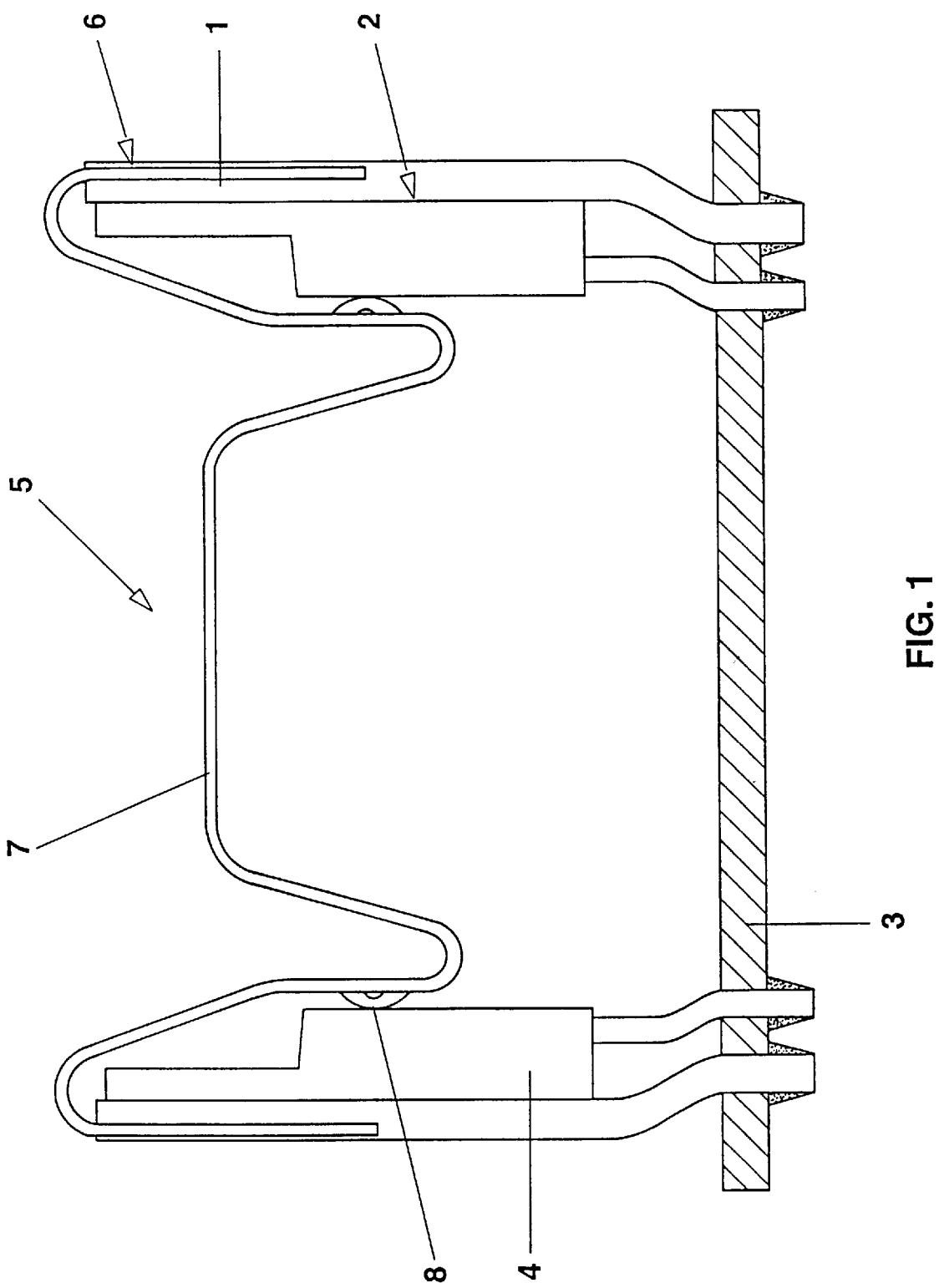
FIG. 1 shows a clip according to the invention in side view.
Figure 2:
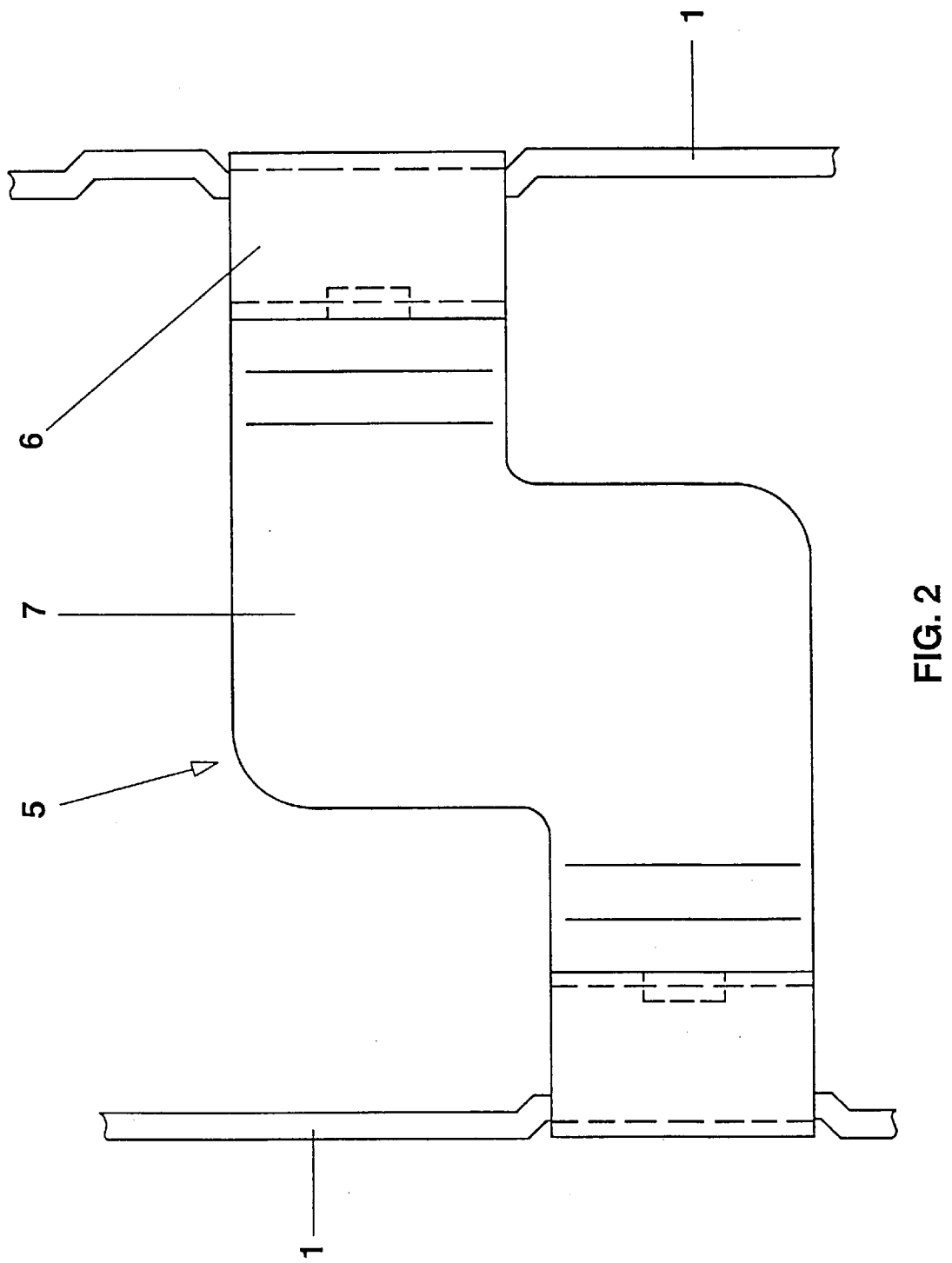
FIG. 2 shows a plan view of the clip from FIG. 1.

The viewing direction is thus in each case in the plane of the largest surface of a power semiconductor held by the clip, moreover in the plane of the mounting board in FIG. 1 and perpendicularly thereto in FIG. 2.

DETAILED DESCRIPTION OF THE PREFERRED EMBODIMENT

FIG. 1 reveals, at the bottom, a mounting board, more precisely a printed circuit board 3, on which a power semiconductor, namely a bipolar transistor 4 with a cooling lug (longer part), and a cooling plate 1 are mounted by the customary insertion feet in each case on the right-hand and left-hand edges of the figure. On its underside, the mounting board 3 contains conductor tracks (not illustrated) to which the insertion feet of the power semiconductors 4 are soldered from below in the manner indicated. The insertion feet of the cooling plates 1 are not necessary but facilitate mounting because the cooling plates 1 do not need to be held fast during emplacement of the clip 5 described below. Advantageously, they are slightly bent in order to be able to yield elastically in the even of mechanical loading during mounting.

The power semiconductors 4 together with their cooling lugs and the cooling plates 1 are held together on both sides by an (inverted) U-shaped holding section 6 of the clip 5. In this case, the cooling lug bears directly on the cooling plate 1. In the present case, this bearing is effected with the largest surface 2 of the power semiconductors 4, which was used at the beginning to define the position of the power semiconductors 4 relative to one another.

On the inner side in the lower region of the respective inner limb of the holding sections 6, a respective projection 8 (already described above) is provided in the form of a part bent out in a round shape and bears on the power semiconductor on the side remote from the cooling lug and cooling plate. The ramp shape already described is not realised in the case of this projection 8.

On the side bearing on the higher cooling plate 1, the U-shape of the holding sections 6 has an elongate, straight course.

A connecting section 7 of the clip 5 extends between the two stacks pressed together by the holdings sections 6; the said connecting section runs essentially transversely and, at the said time, is upwardly set back by an intermediate region with respect to the lower open end of the holding sections. As a result, it leaves underneath it an adequate clearance for the physical height of further circuit sections (not illustrated). Moreover, a suitable effective spring constant of the clip as a whole is set as a result—as already mentioned. The overall shape resulting on both sides of the straight piece of the connecting section is a shape similar to a double S. The straight part of the connecting section 7 is in this case curved upwards slightly (not illustrated) because the distance between the outer points of the projections 8 in the non-deformed state of the clip 5 prior to emplacement is slightly oversized relative to the inner distance between the power semiconductors 4. As a result, the power semiconductors 4 are pressed outwards, to be precise against the cooling plates 1 and the outer limbs of the holding sections 6.

FIG. 2 reveals, in a plan view, the planar design of the connecting section 7 having the described functions of reducing conducted radio interference—in this case primarily by screening interference potentials with respect to an earthed metallic housing or the surroundings—and acting as a further integrated cooling plate. In order to reduce conducted radio interference, the clip 5 is at the collector and cooling-lug potential of one of the two transistors 4 and is insulated from the other by interposed insulation (not illustrated in FIG. 1), for instance a Hostafan film. The screening potential in this case corresponds to the positive supply potential of the bipolar transistor half-bridge assumed in the present case, which supply potential is modulated only with the mains frequency.

Finally, FIG. 2 shows a design of the clip 5 in which the stacks formed by the power semiconductors 4 and the cooling plates 1 are not located precisely opposite one another. Therefore, when projected onto the plane of the mounting board 3, the connecting section 7 has a double-L shape which is matched to this transverse offset. It is evident that, for example, an H-shape would also be possible in the case of four power semiconductors 4 or a straightforward rectilinear shape would also be possible in the case of two power semiconductors.

We claim:

1. A clip (5) having at least two holding sections (6) each having two limbs for pressing against, in a planar manner, a respective surface of one of at least two power semiconductors (4), which lie with their largest surface (2) in different planes and are mounted essentially vertically on a mounting board (3), and a cooling plate (1) between the limbs of each of the holding sections, and having a connecting section (7), which connects the holding sections and extends in a plane which is essentially perpendicular to the limbs of the holding sections.

2. The clip (5) according to claim 1, in which the connecting section (7) is set back with respect to an open end of the holding sections (6).

3. The clip (5) according to claims 2, in which the connecting section (7) is of planar design serving the purpose of heat radiation and/or the reduction of conducted radio interference of circuit sections arranged between it and the mounting board (3) in the mounted state.

4. The clip (5) according to claim 3, in which at least one holding section (6) is designed with an integrated cooling plate.

5. The clip (5) according to claim 4, in which a projection (8) is formed on an inner side of a holding-section limb.

6. The clip (5) according to claim 5, in which the projection (8) is pressed out from the surface of the inner side.

7. The clip (5) according to claim 6, in which the projection (8) has the shape of a ramp rising gently towards the open end of the holding sections (6) and steeply on the opposite side.

8. An electronic assembly comprising at least two power semiconductors (4) and a clip (5), said clip (5) having at least two holding sections (6) each having two limbs for pressing against, in a planar manner, a respective surface of one of said at least two power semiconductors (4), which lie with their largest surface (2) in different planes and are mounted essentially vertically on a mounting board (3), and of a cooling plate (1) between the limbs of each of the holding sections, and having a connecting section (7), which connects the holding sections and extends in a plane which is essentially perpendicular to the limbs of the holding sections.

9. The electronic assembly according to claim 8, in which a distance between the holding sections (6) has a slight oversize and the connecting section (7) has resilient properties.

10. The electronic assembly according to claim 9, in which the power semiconductors (4) are bridge transistors of an electronic converter or electronic ballast for the operation of lamps.

* * * * *